United States Patent
Chuang et al.

(10) Patent No.: US 8,772,114 B2
(45) Date of Patent: Jul. 8, 2014

(54) METAL GATE SEMICONDUCTOR DEVICE AND METHOD OF FABRICATING THEREOF

(75) Inventors: Hak-Lay Chuang, Singapore (SG); Ming Zhu, Singapore (SG); Hui-Wen Lin, Taiping (TW); Bao-Ru Young, Zhubei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 81 days.

(21) Appl. No.: 13/434,969

(22) Filed: Mar. 30, 2012

(65) Prior Publication Data

US 2013/0256805 A1    Oct. 3, 2013

(51) Int. Cl.
    *H01L 21/8234*    (2006.01)
(52) U.S. Cl.
    USPC .................................. 438/275; 257/E21.636
(58) Field of Classification Search
    USPC ........... 438/232, 233, 654, 657; 257/E21.198
    See application file for complete search history.

(56) References Cited

U.S. PATENT DOCUMENTS

| | | | |
|---|---|---|---|
| 7,470,577 B2 * | 12/2008 | Chambers et al. | 438/197 |
| 7,564,102 B2 * | 7/2009 | Yoshihara | 257/369 |
| 2010/0038721 A1 * | 2/2010 | Lin et al. | 438/592 |
| 2010/0052067 A1 * | 3/2010 | Hsu et al. | 438/592 |

OTHER PUBLICATIONS

Jin-Aun Ng, Ming Zhu and Chi-Wen Liu; "Metal Gate Semiconductor Device;" U.S. Appl. No. 13/424,935, filed Mar. 20, 2012; 35 Pages.

Sheng-Chen Chung, Ming Zhu, Jyun-Ming Lin, Bao-Ru Young and Hak-Lay Chuang; "Method of Fabricating a Metal Gate Semiconductor Device;" U.S. Appl. No. 13/434,344, filed Mar. 29, 2012; 53 Pages.

\* cited by examiner

*Primary Examiner* — Chandra Chaudhari
(74) *Attorney, Agent, or Firm* — Haynes and Boone, LLP

(57) ABSTRACT

A method of semiconductor fabrication including forming a first work function metal layer on a first region of the substrate and forming a metal layer on the first work function metal layer and on a second region of the substrate. A dummy layer is formed on the metal layer. The layers are then patterned to form a first gate structure in the first region and a second gate structure in the second region of the substrate. The dummy layer is then removed to expose the metal layer, which is treated. The treatment may be an oxygen treatment that allows the metal layer to function as a second work function layer.

20 Claims, 15 Drawing Sheets

METAL GATE SEMICONDUCTOR DEVICE AND METHOD OF FABRICATING THEREOF

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advances to be realized, similar developments in IC processing and manufacturing are needed.

One advancement implemented as technology nodes shrink, in some IC designs, has been the replacement of the typically polysilicon gate electrode with a metal gate electrode to improve device performance with the decreased feature sizes. One process of forming a metal gate stack is termed a replacement or "gate last" process in which the final gate stack is fabricated "last" which allows for reduced number of subsequent processes, including high temperature processing, that must be performed after formation of the gate. There are challenges to implementing such features and processes in CMOS fabrication however. These challenges increase for devices having different types of gate structures on a single substrate.

Thus, what is desired is a method and semiconductor device providing differently configured metal gate structures for each of NMOS and PMOS transistors formed on a substrate.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

It is to be understood that the following disclosure provides many different embodiments, or examples, for implementing different features of the invention. Specific examples of components and arrangements are described below to simplify the present disclosure. These are, of course, merely examples and are not intended to be limiting. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Figure 1:
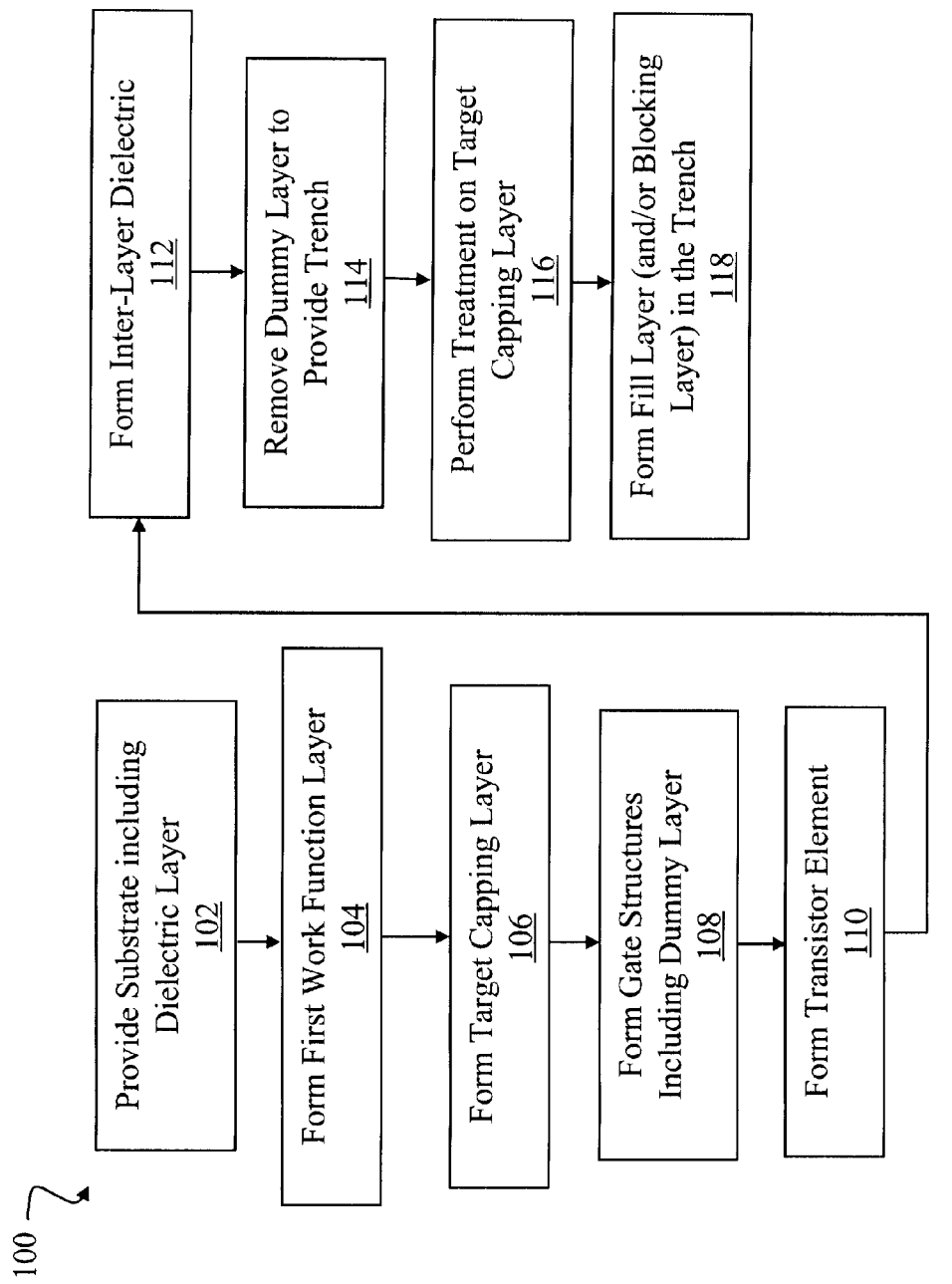
FIG. 1 is a flow chart illustrating an embodiment of a method of fabricating a semiconductor device according to one or more aspects of the present disclosure.

Illustrated in FIG. 1 is a flow chart of a method 100 of fabricating a semiconductor device. The method 100 may be used to implement a metal gate structure on a hybrid semiconductor device. A hybrid semiconductor device includes a plurality of differently configured devices having differently configured gate structures (e.g., gate stacks having different layer compositions, thicknesses, etc). The differently configured gate stacks may be associated with NMOS and PMOS devices respectively. FIGS. 2-11b are cross-sectional views of an embodiment of a device 200 fabricated according to the method 100 of FIG. 1.

Referring to FIGS. 2-11b, illustrated is the semiconductor device 200 at various stages of fabrication in metal gate fabrication process. The semiconductor device 200 includes regions 202 and 204 in which one of N-channel field effect transistor (nFET) and P-channel FET (pFET) devices may be formed. These regions are also referred to as NMOS and PMOS regions. For example, in an embodiment, region 202 is an NMOS region; region 204 a PMOS region. It is understood that part of the semiconductor device 200 may be fabricated by complementary metal-oxide-semiconductor (CMOS) technology process flow, and thus some processes are only briefly described herein.

Further, the semiconductor device 200 may include various other devices and features, such as additional transistors, bipolar junction transistors, resistors, capacitors, diodes, fuses, etc., but is simplified for a better understanding of the inventive concepts of the present disclosure. The semiconductor device 200 includes a plurality of semiconductor devices (e.g., transistors), which may be interconnected. The device 200 illustrates a single gate structure in each of two regions of the substrate; this is provided for simplification and ease of understanding and does not necessarily limit the embodiment to any number of gate structures, any number of regions, or any configuration of structures of regions.

The method 100 begins at block 102 where a semiconductor substrate having a gate dielectric layer disposed thereon is provided. The semiconductor substrate may be a silicon substrate. The substrate may include various doping configurations depending on design requirements as is known in the art. The substrate may also include other elementary semiconductors such as germanium and diamond. Alternatively, the substrate may include a compound semiconductor and/or an alloy semiconductor. Further, the substrate may optionally include an epitaxial layer (epi layer), may be strained for performance enhancement, may include a silicon-on-insulator (SOI) structure, and/or have other suitable enhancement features.

The substrate may include isolation features such as a shallow trench isolation (STI), field oxide, a LOCOS feature, and/or other suitable isolation features. The isolation structure may be formed of silicon oxide, silicon nitride, silicon oxynitride, fluoride-doped silicate glass (FSG), a low-k dielectric, combinations thereof, and/or other suitable material known in the art.

A gate dielectric layer is formed on the substrate. The gate dielectric layer may include an interfacial layer and/or high-k dielectric layer formed over the substrate. The interfacial layer may include a silicon oxide layer ($SiO_2$) or silicon oxynitride (SiON). The thickness of the interfacial layer may be between approximately 5 to 10 angstroms (A). The interfacial layer may be a thermally grown oxide. A high-k dielectric layer may be formed on the interfacial layer by atomic layer deposition (ALD) or other suitable technique. The high-k dielectric layer may include a thickness ranging from approximately 10 to 40 A. The high-k dielectric layer may include hafnium oxide ($HfO_2$). Alternatively, the high-k dielectric layer may include other high-k dielectrics, such as $TiO_2$, HfZrO, $Ta_2O_3$, $HfSiO_4$, $ZrO_2$, $ZrSiO_2$, combinations thereof, or other suitable material. Further, the high-k gate dielectric layer may include a multiple layer configuration.

Figure 2:
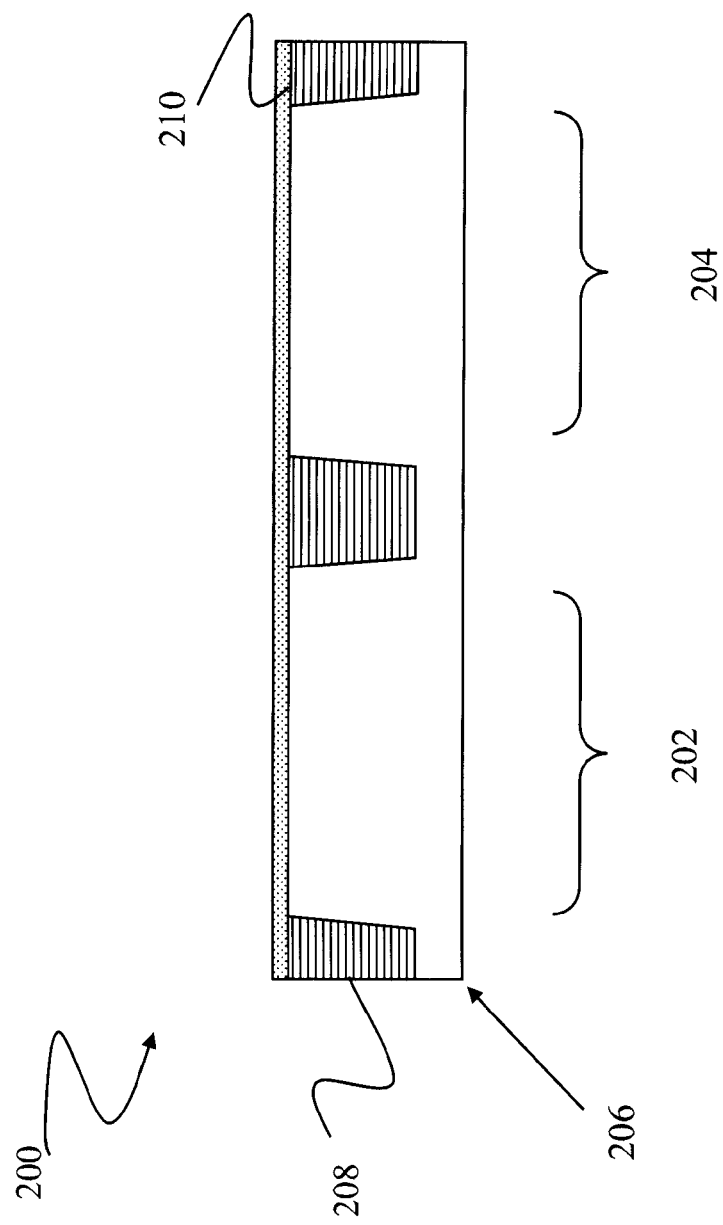
FIGS. 2-11b illustrate cross-sectional views of an embodiment of a semiconductor device fabricated according to one or more steps of the method of FIG. 1.
Figure 3:
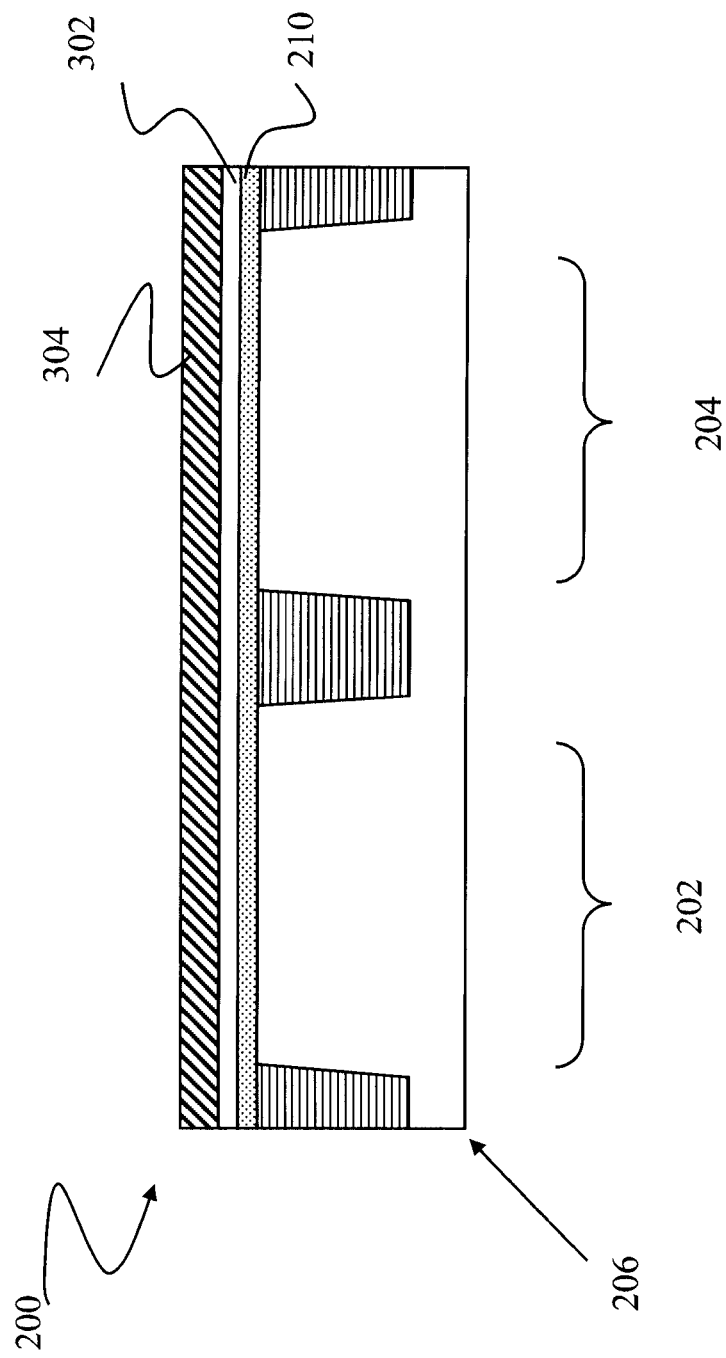

Referring to the example of FIG. 2, the semiconductor device 200 is illustrated. The semiconductor device 200 includes a semiconductor substrate 206 having a first region 202 and a second region 204. In an embodiment, the first region 202 is a region in which one of an N-channel field effect transistor (nFET) and P-channel FET (pFET) devices may be formed; the second region 204 is a region in which the other one of an N-channel field effect transistor (nFET) and P-channel FET (pFET) devices may be formed. For example, in a further embodiment, the first region 202 provides an NMOS or nFET region; the second region 204 provides a PMOS or pFET region.

The substrate 206 includes isolation features 208. The isolation features 208 are illustrated as STI features, however other embodiments are possible. A gate dielectric layer 210 is formed on the substrate 206. The gate dielectric layer 210 may include an interfacial layer and a high-k dielectric layer (also referred to herein as IL/HK).

The method 100 then proceeds to block 104 where a first work function layer is formed on substrate. The first work function layer may be formed over the gate dielectric layer. The first work function layer may be associated with one of a pFET and nFET device. In a further embodiment, the first work function layer is provided for an NMOS work function. In an embodiment, the first work function layer includes at least two layers (e.g., a bilayer). For example, the first work function layer may include a capping layer and a metal gate layer. It is noted that the first work function layer may be selected taking into account the requirements of a single device type (e.g., NMOS) as the first work function layer may be formed only on a region of the substrate (e.g., NMOS) region.

In an embodiment, the first work function layer includes a capping layer. The capping layer may assist to tune a work function of a metal layer (e.g., a metal gate layer) to provide proper performance of a transistor. In an embodiment, the capping layer includes lanthanum oxide (LaOx). In a further embodiment, the capping layer is $La_2O_3$; however, other compositions are possible. The capping layer may be formed by ALD, chemical vapor deposition, physical vapor deposition, and/or other suitable process. Referring to the example of FIG. 3, a capping layer 302 is formed on the substrate 206. In an embodiment, the capping layer 302 is between approximately 5 and 20 A in thickness. In an embodiment, the capping layer 302 is LaOx.

The first work function layer may include a metal gate layer. In an embodiment, the metal gate layer includes an N-type work function metal (N-metal) suitable to provide an NMOS transistor. In a further embodiment, the metal gate layer includes Ti-rich TiN. Other examples include TaN, $ZrSi_2$, $MoSi_2$, $TaSi_2$, $NiSi_2$, WN, combinations thereof, and/or other suitable material. The metal gate layer may be formed by various deposition techniques, such as chemical vapor deposition (CVD), physical vapor deposition (PVD or sputtering), plating, or other suitable technique. Referring to the example of FIG. 3, a metal gate layer 304 is formed on the substrate 206. In an embodiment, the metal gate layer is between approximately 20 and 50 A. The metal gate layer 304 may be an N-type metal, for example, providing a work function suitable for an NMOS device formed in region 202 of the substrate 206. In a further embodiment, the metal gate layer 304 is Ti-rich TiN.

The first work function layer may be conformally deposited onto the substrate and subsequently patterned. See FIGS. 3-4. The patterning may be done by depositing photosensitive material, exposing the photosensitive material to a pattern, and developing the patterned photoresist to form a masking element. The masking element may protect the first work function on one region of the substrate (e.g., a region for NMOS devices), while the first work function layer is removed from another region of the substrate (e.g., a region for PMOS devices).

Figure 4:
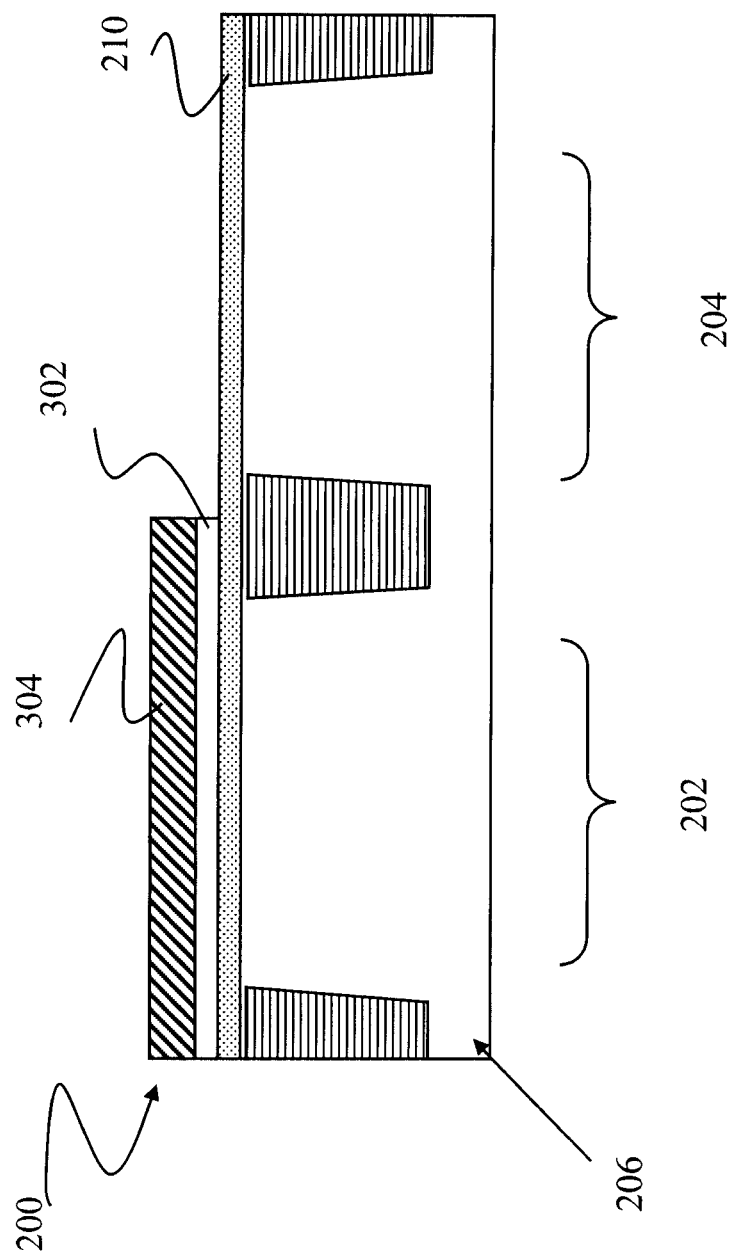
Figure 5:
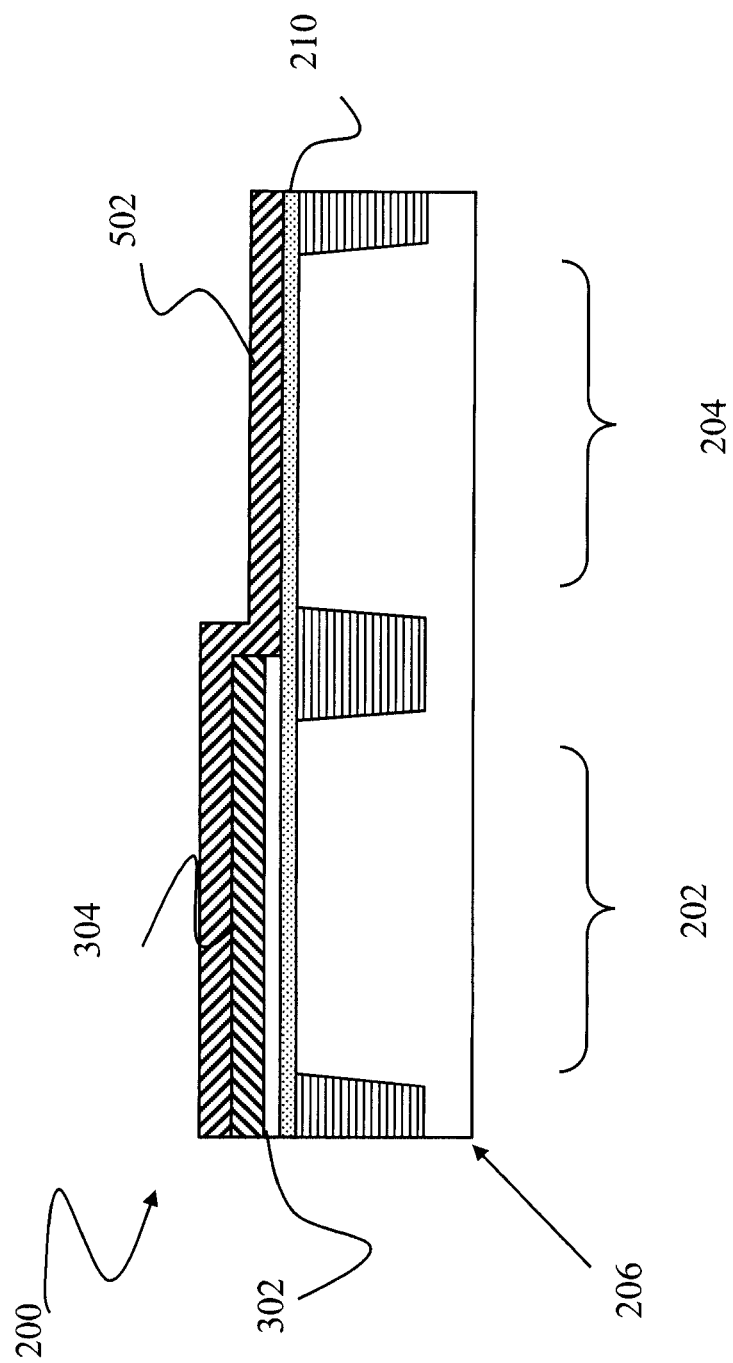

Referring to the example of FIG. 4, the metal gate layer 304 and the capping layer 302 are patterned such that the layers are removed from the region 204 of the substrate. The first work function layers 302 and 304 remain on the region 202 of the substrate 206. In an embodiment, the region 202 is a region for providing NMOS type devices.

The method 100 then proceeds to block 106 where a target capping layer is formed on the substrate. The target capping layer may be a layer suitable for transforming into a work function layer. For example, in an embodiment, the work function provided by the target capping layer (e.g., after modification, such as discussed below with reference to block 116) may be associated with the opposite type as the first work function layer of block 104 (e.g., P-type). In an embodiment, the target capping layer is N-rich TiN. In an embodiment, the target capping layer is formed having substantially uniform thickness on the substrate, for example, in the NMOS region and the PMOS region of the substrate. Referring to the example of FIG. 5, a target capping layer 502 is formed on the substrate 206 overlying the first region 202 and the second region 204. In an embodiment, the thickness of the target capping layer 502 may be between approximately 20 and 50 A.

The method 100 then proceeds to block 108 where a gate structure is formed including a dummy (or sacrificial) layer. In an embodiment, the dummy layer includes polysilicon, also referred to as a dummy poly layer. The gate structure having a dummy layer may be formed using suitable replacement gate processes. For example, the dummy layer may be formed by suitable deposition processes such as, for example, low-pressure chemical vapor deposition (LPCVD) and plasma-enhanced CVD (PECVD). The dummy layer may overly the first hard mask layer, the target capping layer, gate dielectric and interface layer. The layers are then patterned to form gate structures. In an embodiment, a hard mask layer used in patterning the gate structures and is disposed on the gate structures. Exemplary compositions of the hard mask layer include silicon oxide, silicon nitride, combinations thereof, and/or other suitable compositions.

Figure 6:
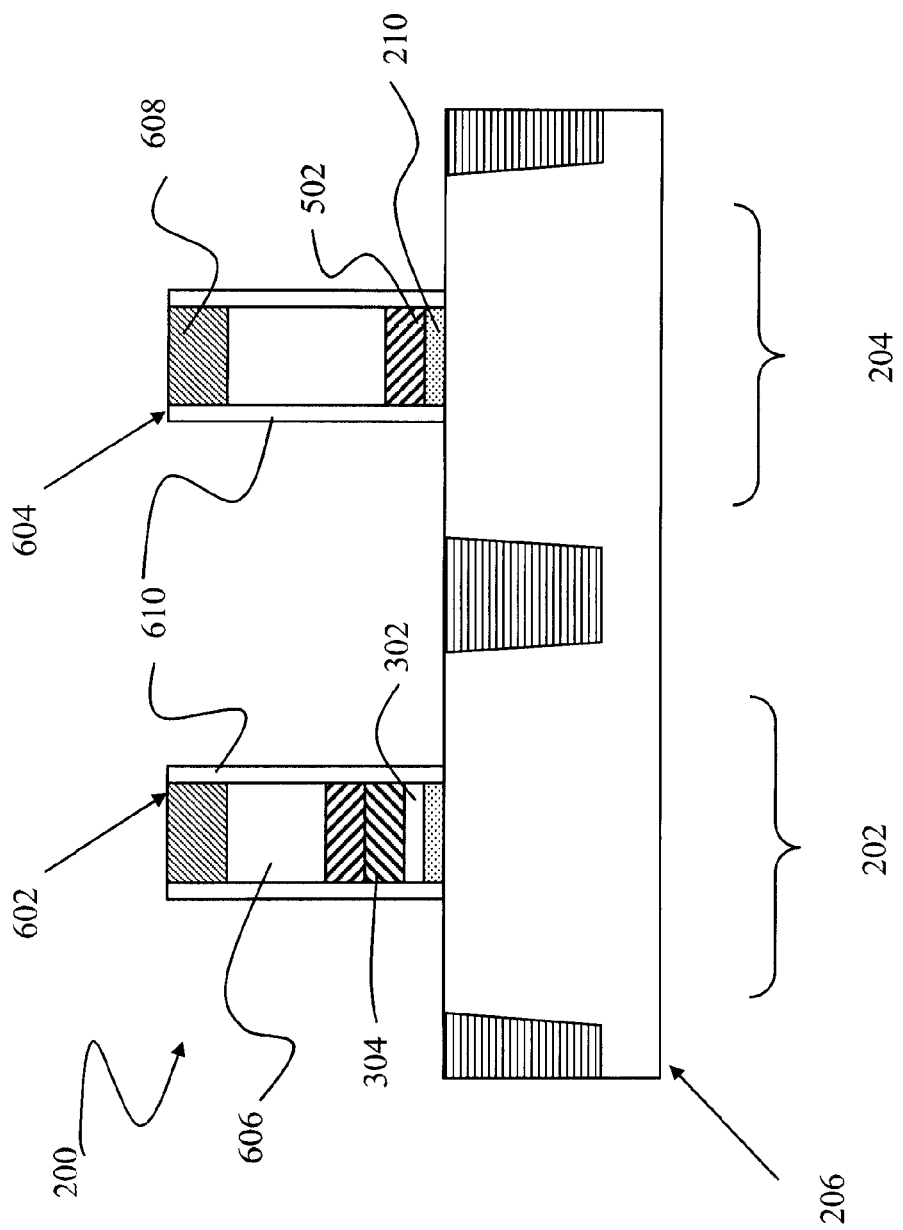

Referring to the example of FIG. 6, gate structures 602 and 604 are formed on the substrate. The gate structures 602 and 604 may be formed using suitable photolithography and etching processes. The gate structure 602 is disposed in the first region 202 and includes the gate dielectric layer 210, the capping layer 302, the metal gate layer 304, the target capping layer 502, a sacrificial polysilicon layer 606, and a hard mask layer 608. The gate structure 602 also includes seal liner or spacer wall elements 610 abutting the side wall of the structure. In an embodiment, element 610 includes silicon nitride. However, other suitable dielectrics are possible. In an embodiment, the gate structure 602 is associated with an NMOS device.

The gate structure 604 is disposed in the second region 204 and includes the gate dielectric layer 210, the target capping layer 502, the sacrificial polysilicon layer 606, and the hard mask layer 608. The gate structure 604 also includes elements 610. In an embodiment, the gate structure 604 is associated with an PMOS device.

The method 100 then proceeds to block 110 where a transistor element (or elements) is formed using suitable processes known in the art. Exemplary elements formed in block 110 include source/drain regions. The source/drain regions may include halo or low-dose drain (LDD) implantation processes, source/drain implantation processes, source/drain activation processes, and/or other suitable processes. In other embodiments, the source/drain regions may include raised source/drain regions, strained regions, epitaxially grown regions, and/or other suitable techniques. The source/drain regions may be formed by introducing p-type or n-type dopants or impurities into the substrate 206 depending on the configuration of the transistors. The source/drain regions formed may include silicide features formed on the source/drain regions, for example, by a salicide (self-aligned silicide) process to form a contact. The silicide features may include nickel silicide, cobalt silicide, tungsten silicide, tantalum silicide, titanium silicide, platinum silicide, erbium silicide, palladium silicide, combinations thereof, and/or other suitable conductive material. One or more spacer elements may be formed before or after the formation of the source/drain regions. Etch stop layers such as contact etch stop layer (CESL) may also be disposed on and/or adjacent the gate structures. The ESL may be formed by CVD, high density plasma CVD (HDP-CVD), spin-on coating, PVD, and/or other suitable method. The above described transistor features are illustrative only and not intended to be limiting. One of ordinary skill in the art would recognize other features that may be formed during the CMOS processing.

Figure 8A:
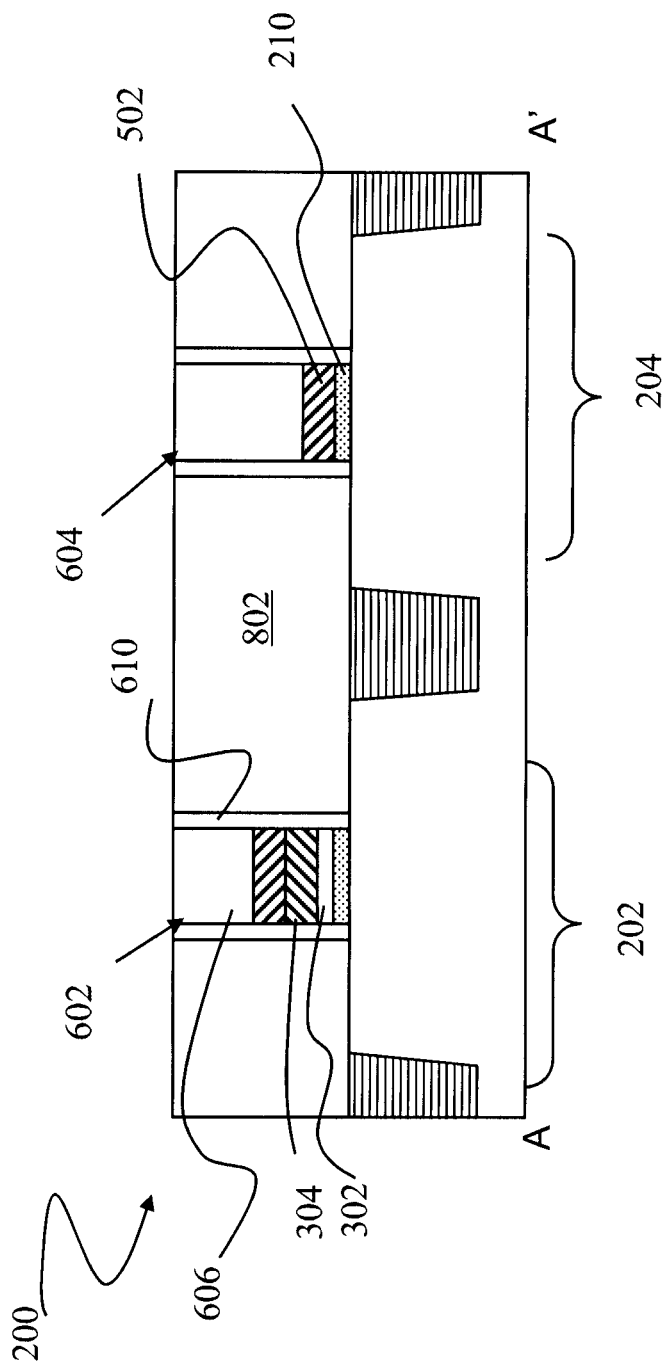
Figure 8B:
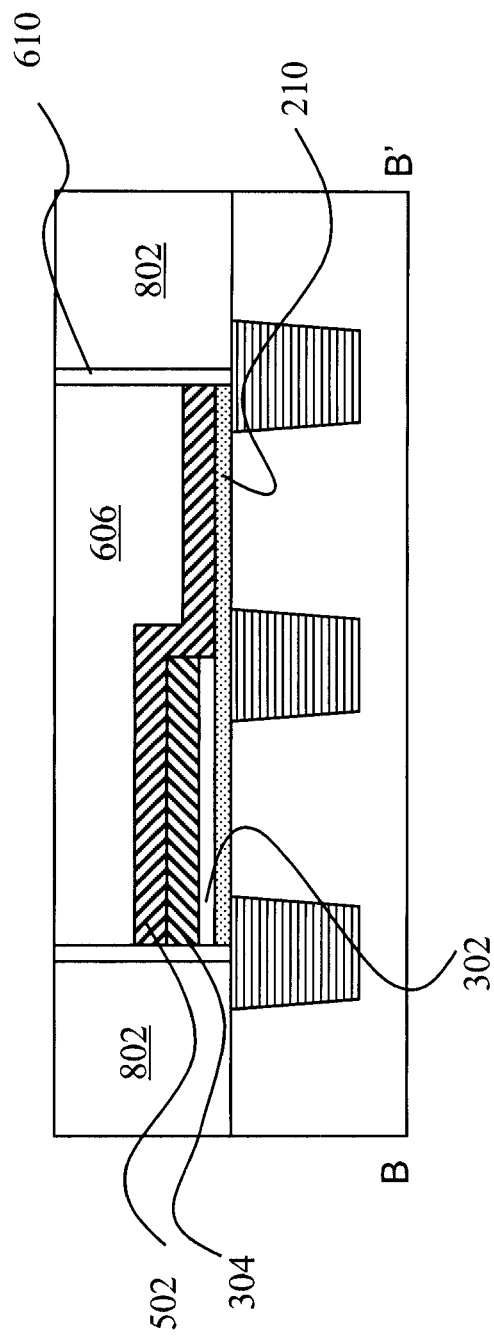
Figure 9A:
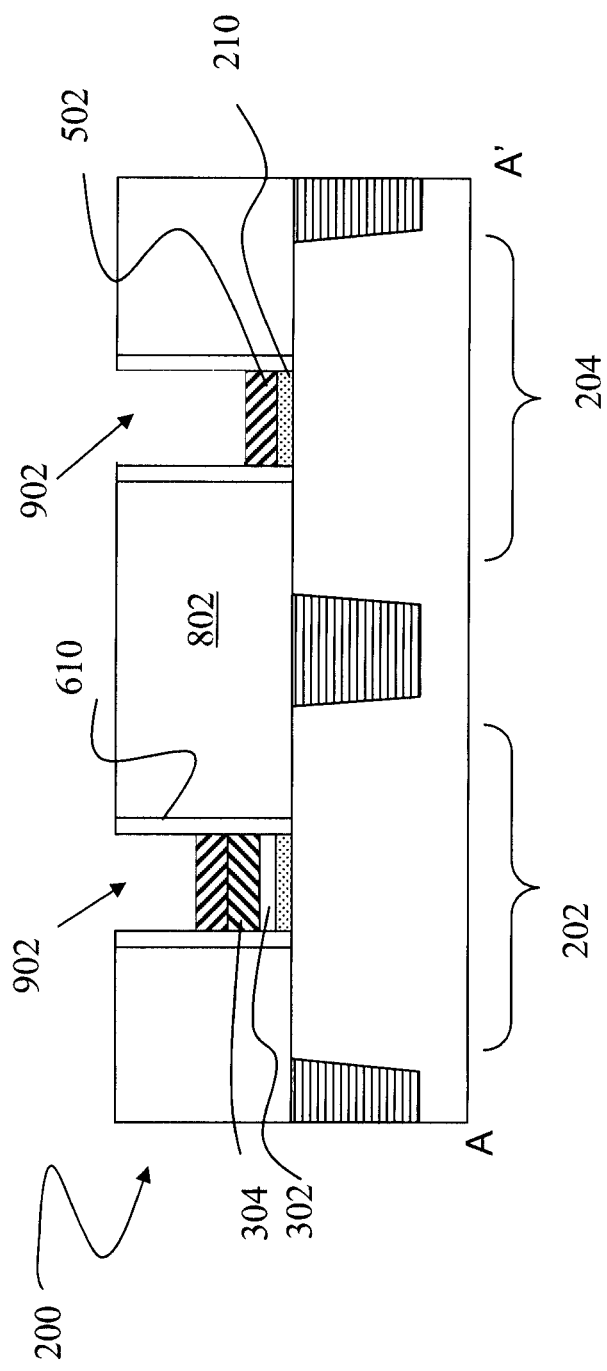
Figure 9B:
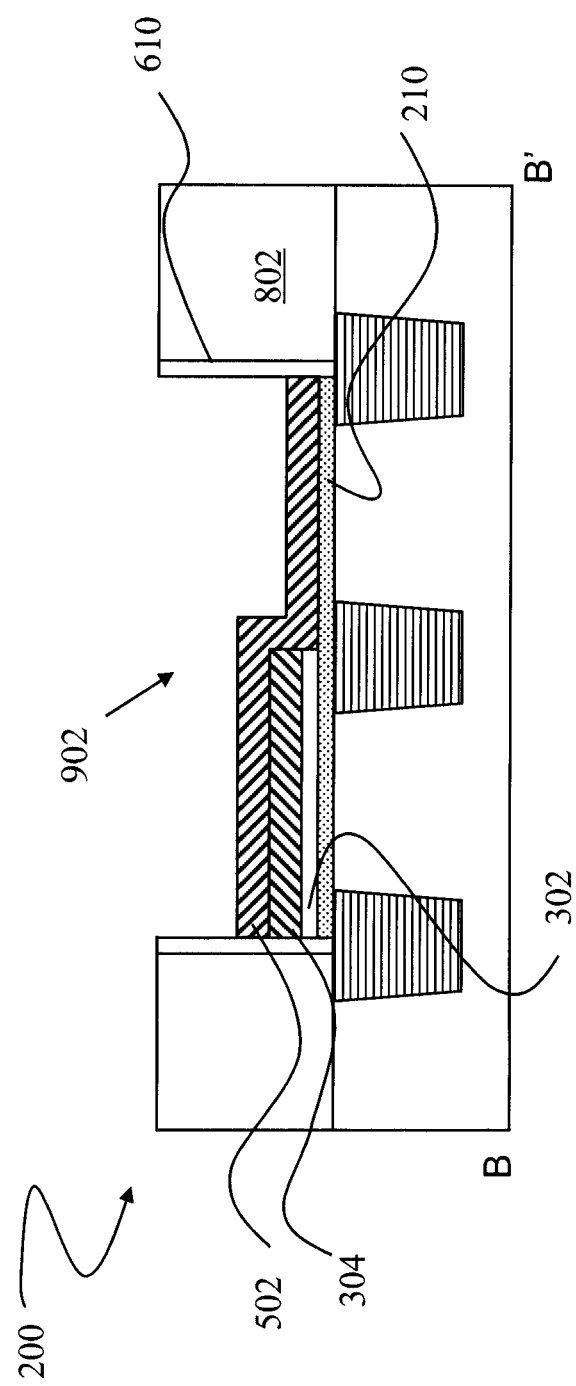

The method 100 then proceeds to block 112 where an inter-layer (or level) dielectric (ILD) layer may be formed. The ILD layer may be formed using CVD, HDP-CVD, spin-on coating, PVD and/or other suitable method. The ILD layer may include silicon oxide, silicon oxynitride, a low-k material, and/or other suitable dielectric material. Referring to the example of FIGS. 8a and 8b, an ILD layer 802 is disposed on the substrate. After depositing the ILD layer, the layer may be etched back such that it is removed from a region overlying the gate structure, exposing a top layer of the gate structure. In an embodiment, the hard mask layer on the gate structure is also removed. As illustrated in FIGS. 8a and 8b, the ILD layer 802 has been planarized such that a top surface of the dummy layer (e.g., sacrificial polysilicon) is exposed.

Figure 7:
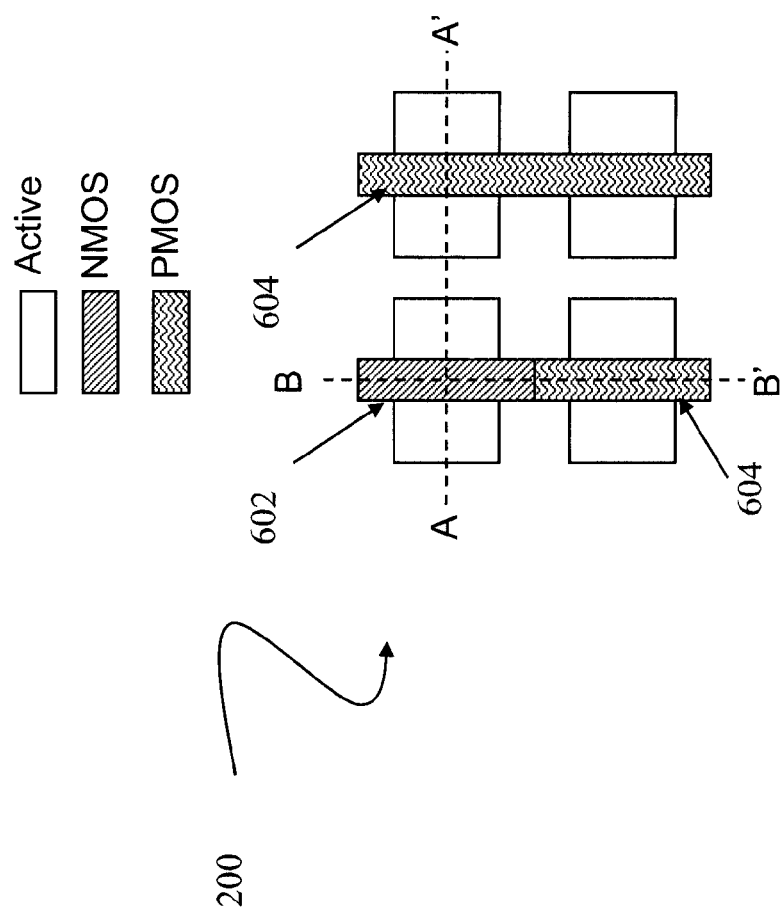

It is noted that FIGS. 8a and 8b, and the figures following therefrom, illustrate the device 200 along each of two different plains, designated "A" and "B". FIG. 7 illustrates the device 200 from a top-level view and designates the "A" and "B" planes illustrated in the remaining figures. It is noted that FIG. 7 includes a designation of NMOS and PMOS that is illustrative and not intended to be limiting to any specific configuration of NMOS/PMOS arrangement.

The method 100 then proceeds to block 114 where a dummy layer of the gate structures is removed to provide trenches. In an embodiment, the dummy layer (e.g., polysilicon) of the gate structures may be removed in both the NMOS and PMOS regions of the substrate simultaneously. The removal may be done by wet etch and/or other suitable process. Referring to the example of FIGS. 9a and 9b, trenches 902 are formed by the removal of the dummy layer 606 (see FIG. 6).

The method 100 then proceeds to block 116 where a treatment is performed on the target capping layer, described above with reference to block 106. The treatment may be a blanket treatment (e.g., performed on both regions (NMOS and PMOS) simultaneously). In an embodiment, the treatment is an oxygen treatment (e.g., exposing the target capping layer to oxygen). The oxygen treatment may provide for introduction of oxygen into the target capping layer. In an embodiment, the treatment process is a plasma treatment. The treatment process may be performed using a source power of between approximately 200 and 1000 Watts (W). The treatment process may be performed under a pressure of approximately 2 to 5 milliTorr (mTorr). The source gas may be $O_2$, $O_3$, $H_2O$, and/or other oxygen source. It is noted that these process parameters are exemplary only and not intended to be limiting.

The treatment may provide for the oxidation of the target capping layer. In an embodiment, the treatment modifies the composition of the target capping layer such that it provides a suitable work function for a p-type device (e.g., p-metal). For example, in an embodiment, the treatment modifies a N-rich TiN layer to provide TiON.

Figure 10A:
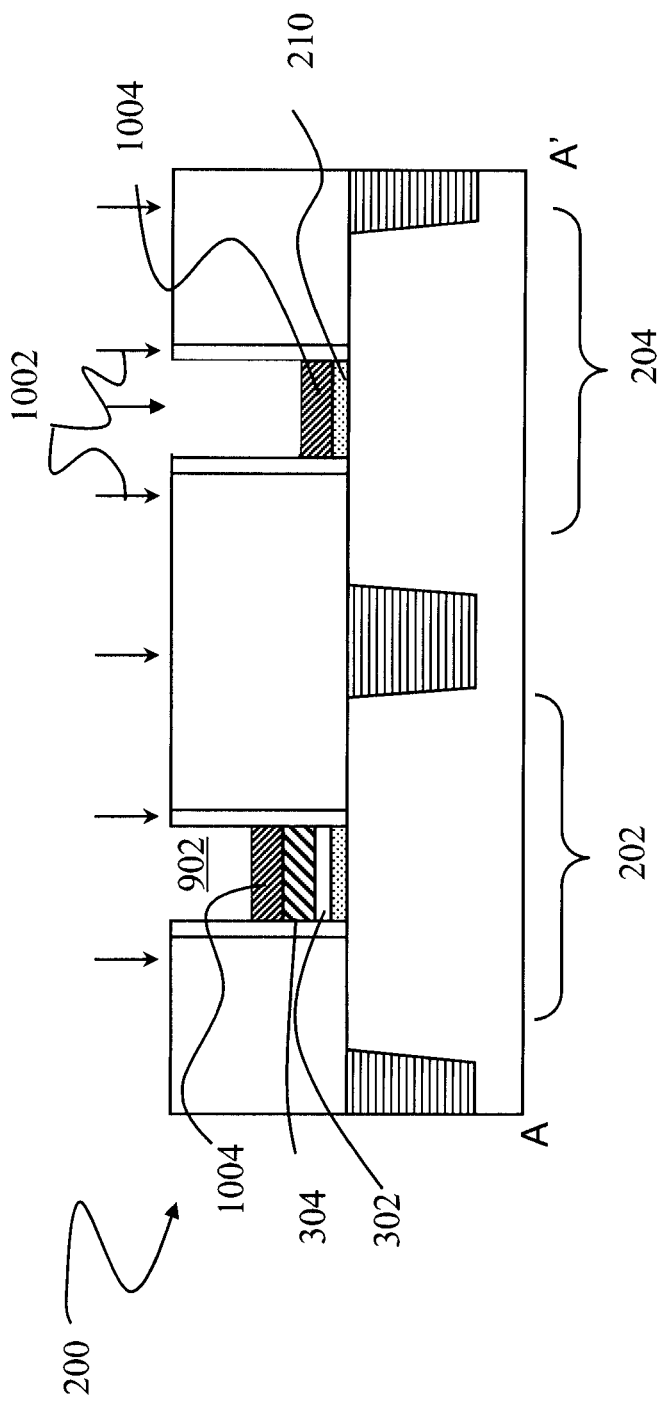
Figure 10B:
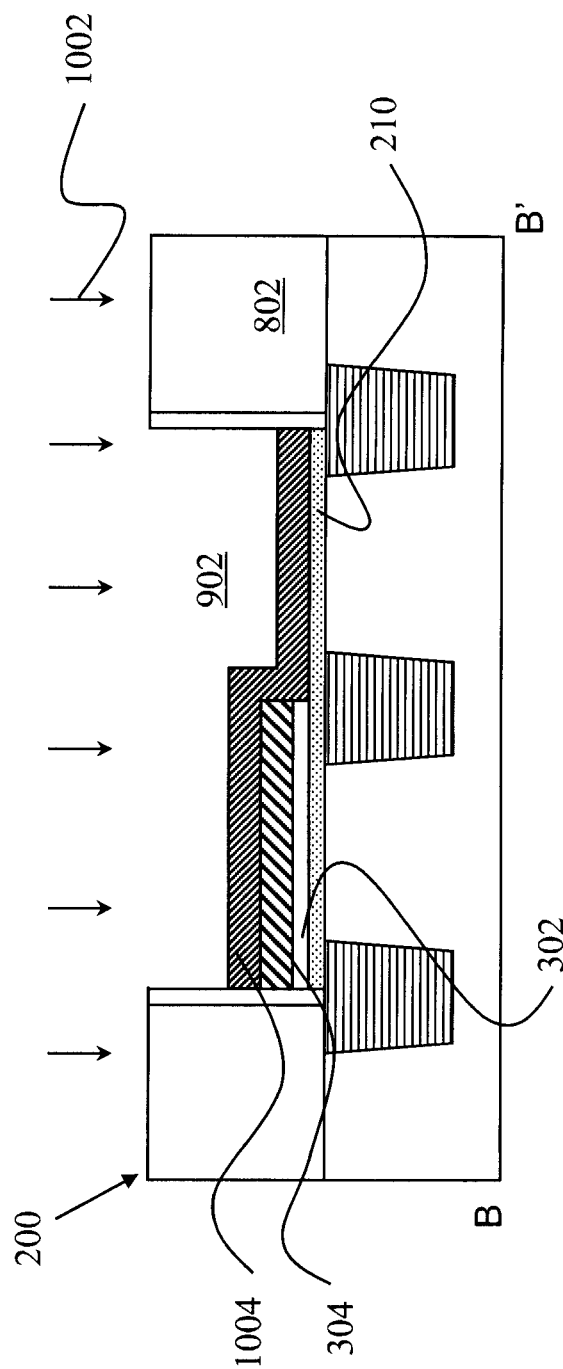
Figure 11A:
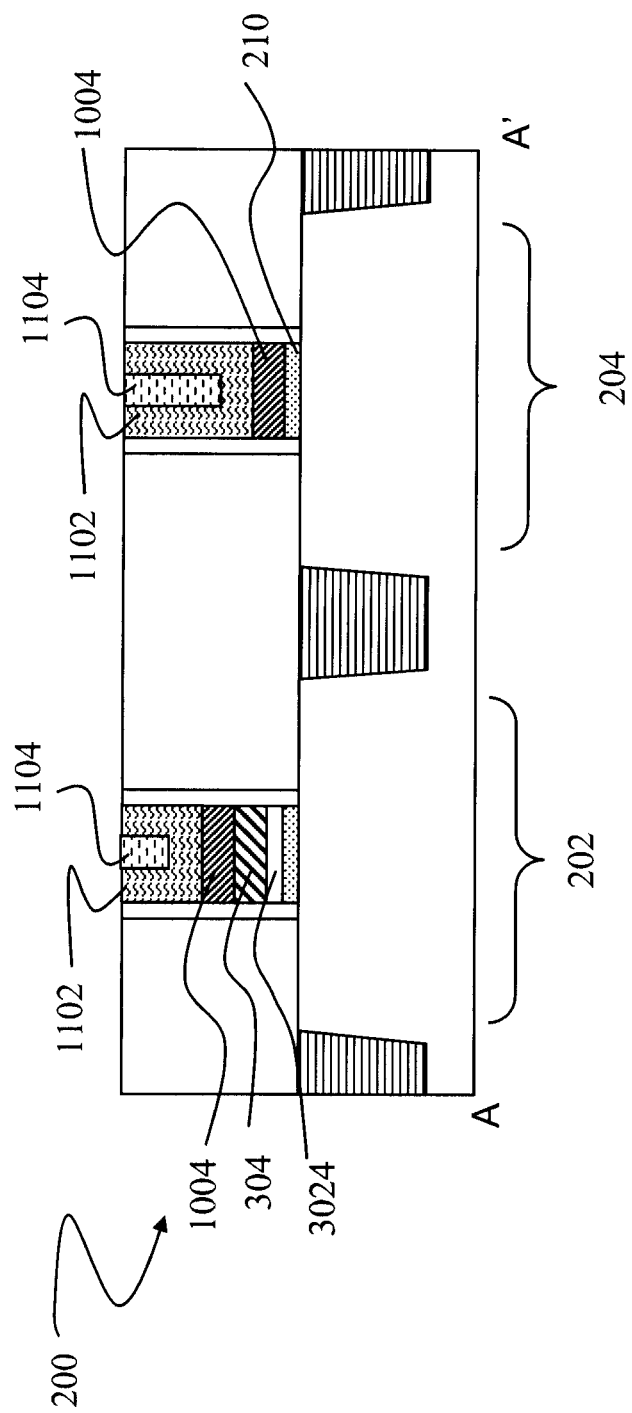
Figure 11B:
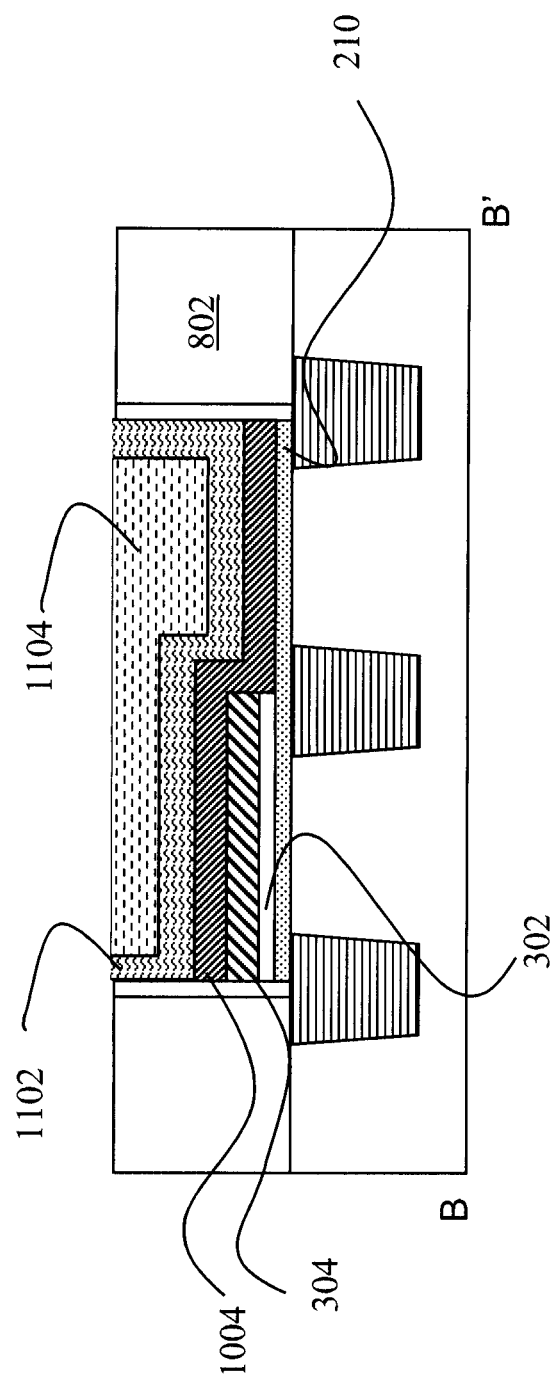

Referring to the example of FIGS. 10a and 10b, a treatment 1002 is performed on the substrate 206. The treatment 1002 may be an oxygen treatment as discussed above. The treatment 1002 modifies the target capping layer 502 to provide modified capping layer 1004. The modified capping layer 1004 may perform as a p-metal (e.g., providing a work function for a PMOS device). In an embodiment, the modified capping layer 1004 provides the work function for the gate formed in region 204 of the substrate 206. In an embodiment, the modified capping layer 1004 is TiON.

Accordingly, the method 100, in embodiments, may be considered as a hybrid process including a gate first flow to form the metal gate of the NMOS device and a gate last flow to form the metal gate layer of the PMOS device.

The method 100 then proceeds to block 118 where fill layer(s) are formed on the substrate. The fill layer(s) may be formed in the trenches provided by the removal of the dummy layer. In an embodiment, a blocking layer is first deposited in the trenches. The blocking layer may impede and/or eliminate the diffusion of unwanted material particles (e.g., Al) from diffusing into the underlying gate layers. In an embodiment, the blocking layer includes TiN, TaN, combinations thereof, and/or other suitable compositions. A filler metal layer such as Al may then be deposited over the blocking layer and fill the remaining portion of the trenches provided by the removal of the dummy layer. Other exemplary compositions for the filler metal layer include W, Cu, and/or other suitable conductive materials. The filler metal and/or blocking layers may be formed by CVD, PVD, plating, or other suitable process In an embodiment, after forming the fill metal layers, a CMP (e.g., metal CMP process) process may be performed on the layers (e.g., blocking and/or filler layers) to remove the layers from the surface of the ILD layer. Referring to the example of FIGS. 11a and 11b, a blocking layer 1102 and a filler layer 1104 are disposed on the substrate 206. The filler layer 1104 and the blocking layer 1102 fill the remaining area of the trenches 902. In other embodiments, the blocking layer 1102 is omitted.

In summary, the methods and devices disclosed herein provide for differently configured gate structures (e.g., NMOS and PMOS) to be formed on a single substrate. Each of the configured gate structures (e.g., NMOS and PMOS) may provide for a metal capping or work function layer that is different in each of the gate structures, thus allowing for a flexible and suitable design. Furthermore, embodiments of the method provide advantages in efficiency of fabrication. For example, embodiments of the methods described may save process steps typical of a conventional replacement gate process including metal layer depositions, etching processes, and metal CMP process, each which are costly and can introduce error into the device. It is further noted that embodiments of the method allow for a single dummy layer (e.g., polysilicon) removal. This reduces N/P boundary concerns.

Thus, it will be recognized that described in an embodiment is a method of semiconductor device fabrication. The method of semiconductor fabrication includes forming a first work function metal layer on a first region of the substrate and forming a metal layer on the first work function metal layer and on a second region of the substrate. A dummy layer is formed on the metal layer. The layers are then patterned to form a first gate structure in the first region and a second gate structure in the second region of the substrate. The dummy layer is then removed to expose the metal layer, which is treated. The treatment may be an oxygen treatment that allows the metal layer to function as a second work function layer. In an embodiment, the treatment includes transforming the composition of the metal layer (e.g., TiN to TiON).

In another of the broader forms of the embodiments described, a method includes forming a first gate structure associated with a NMOS transistor, the first gate structure including a gate dielectric, a first metal layer on the gate dielectric, and a second metal layer overlying the first metal layer. A second gate structure is also formed and associated with a PMOS transistor. The second gate structure includes the gate dielectric and the second metal layer formed on the gate dielectric. A dummy layer is formed in both the first gate structure and the second gate structure overlying the second metal layer. After performing one or more processes, the dummy layer is removed simultaneously in both the first gate structure and the second gate structure to form trenches. The trenches are then filled with a fill metal.

In a further embodiment of the method, the second metal layer is treated after the dummy layer is removed and prior to the formation of the fill metal. The treatment may modify the composition of the second metal layer such that it provides a work function for the PMOS transistor.

Also provided is a semiconductor device. The device includes a first gate structure including a first type of work function material, a second type of work function material overlying the first type of work function material, wherein the second type of work function material includes oxygen. A fill layer overlies the second type of work function material. A second gate structure includes the second type of work function material and the fill layer overlying the second type of work function material.

In a further embodiment of the device, the first gate structure is associated with an NMOS device (e.g., provides the gate electrode for an nFET), and the second gate structure is associated with a PMOS device (e.g., provides the gate electrode for a pFET). In certain embodiments, the fill layer includes a blocking layer and a filler metal layer. In an embodiment, the second type of work function material is TiON and/or the first type of work function material is Ti-rich TiN.

What is claimed is:

1. A method, comprising:
    forming a first work function metal layer on a first region of the substrate, wherein the first region is defined to include devices of one of a p-type and an n-type;
    forming a metal layer on the first work function metal layer in the first region and on a second region of the substrate, wherein the second region is defined to include devices of the other of a p-type and an n-type;
    forming a dummy layer on the metal layer in the first region and the second region;
    patterning the dummy layer, first work function metal layer, and the metal layer to form a first gate structure in the first region and a second gate structure in the second region of the substrate, wherein the first gate structure includes the dummy layer, the first work function metal layer and the metal layer and the second gate structure includes the dummy layer and the metal layer;
    after forming the first gate structure and the second gate structure, removing the dummy layer to expose the metal layer; and
    treating the metal layer in the first region and the second region.

2. The method of claim 1, wherein the treating includes an oxygen treatment.

3. The method of claim 1, wherein the treating includes transforming a composition of the metal layer.

4. The method of claim 3, wherein the transformed composition provides a work function for a p-type device.

5. The method of claim 3, wherein the transforming the composition includes transforming from a TiN composition to a TiON composition.

6. The method of claim 1, wherein the first gate structure is associated with an nFET device, and the second gate structure is associated with a pFET device.

7. The method of claim 1, wherein the first work function metal layer includes a capping layer and another metal layer.

8. The method of claim 7, further comprising:
    forming fill layer including a blocking layer and a filler metal layer on the treated metal layer.

9. A method, comprising:
    forming a portion of a first gate structure associated with a NMOS transistor, wherein the portion of the first gate structure includes a gate dielectric, a capping layer, a first metal layer on the capping layer, and a second metal layer overlying the first metal layer, wherein the first metal layer is an n-type metal;
    forming a portion of a second gate structure associated with a PMOS transistor, wherein the portion of the second gate structure includes the gate dielectric and the second metal layer formed on the gate dielectric, and wherein the second gate structure does not include the first metal layer;
    forming a dummy layer on the portion of the first gate structure and on the portion of the second gate structure overlying the second metal layer;
    removing the dummy layer simultaneously in both the first gate structure and the second gate structure to form trenches; and
    filling the trenches with a fill metal.

10. The method of claim 9, further comprising:
    treating the second metal layer after removing the dummy layer and before filling the trenches.

11. The method of claim 10, wherein the treating introduces oxygen to the second metal layer.

12. The method of claim 9, wherein the forming the portion of the second gate structure includes forming the second metal layer directly on the gate dielectric.

13. The method of claim 9, wherein the forming the portion of the first gate structure includes:
    forming the gate dielectric layer on a substrate in a first and second region of the substrate;
    forming a capping layer and the first metal layer on the substrate and patterning the capping layer and the first metal layer to be disposed only on the first region of the substrate;
    forming the second metal layer on the substrate on the first and second regions of the substrate; and patterning the gate dielectric layer, the capping layer, the first metal layer, and the second metal layer to form the portion of the first gate structure in the first region of the substrate.

14. The method of claim 9, wherein the dummy layer is polysilicon.

15. A method, comprising:
forming a portion of a first gate structure associated with a first type of transistor, wherein the portion of the first gate structure includes a capping layer, a first metal layer having a first type of work function on the capping layer, and a second metal layer overlying the first metal layer;
forming a portion of a second gate structure associated with a second type of transistor, wherein the portion of the second gate structure includes the gate dielectric and the second metal layer formed on the gate dielectric;
treating the second metal layer of the first gate structure and the second gate structure; and
forming a fill layer on the treated second metal layer of the first gate structure and the second gate structure.

16. The method of claim 15, wherein the forming the portion of the second gate structure does not include forming the first metal layer in the second gate structure.

17. The method of claim 15, further comprising:
forming a dummy layer on the portion of the first gate structure and on the portion of the second gate structure overlying the second metal layer prior to the treating of the second metal layer; and
removing the dummy layer simultaneously in both the first gate structure and the second gate structure to form trenches.

18. The method of claim 15, wherein the treating the second metal layer includes an oxygen treatment.

19. The method of claim 15, wherein the second metal layer is TiN prior to the treating, and wherein the treating forms a TiON composition for the second metal layer.

20. The method of claim 15, wherein forming the portion of the first gate structure associated with the first type of transistor includes forming a n-type of transistor.

* * * * *